(12) United States Patent
Wu

(10) Patent No.: US 6,358,818 B1
(45) Date of Patent: Mar. 19, 2002

(54) METHOD FOR FORMING TRENCH ISOLATION REGIONS

(75) Inventor: Shye-Lin Wu, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 09/361,447

(22) Filed: Jul. 26, 1999

Related U.S. Application Data

(63) Continuation-in-part of application No. 09/034,635, filed on Mar. 4, 1998, now Pat. No. 5,985,737.

(51) Int. Cl.⁷ .............................................. H01L 21/762
(52) U.S. Cl. ....................................... 438/431; 438/692
(58) Field of Search ................................. 438/431, 432, 438/FOR 227, 692

(56) References Cited

U.S. PATENT DOCUMENTS 5,521,422 A 5/1996 Mandelman et al.

OTHER PUBLICATIONS

Pierre C. Fazan et al., A Highly Manufacturable Trench Isolation Process for Deep Submicron DRAMs, IEDM 1993, pp. 3.6.1–3.6.4.

*Primary Examiner*—George Fourson
(74) *Attorney, Agent, or Firm*—Powell, Golstein, Frazer & Murphy, LLP

(57) ABSTRACT

The method for forming an isolation region in the present invention mainly includes the following steps. First, a pad layer is formed on a semiconductor substrate and an oxidation masking layer is formed on the pad layer. The oxidation masking layer, the pad layer, and the substrate are then patterned to form trenches in the substrate. The pad layer is removed laterally to form undercut structures under the oxidation masking layer. A doped layer is conformably formed on the oxidation masking layer, the undercut structures of the pad layer, and the substrate in the trenches. Next, a thermally oxidizing step is carried out to oxidize the doped layer to form an oxidized layer conformably on the oxidation masking layer, the undercut structures of the pad layer, and the substrate in the trenchs. A dielectric layer is formed over the substrate to fill up the trenches and cover over the pad layer and the oxidation masking layer. The dielectric layer is planarized downward to portions of the oxidation masking layer. Finally, the oxidation masking layer and the pad layer are removed.

18 Claims, 5 Drawing Sheets

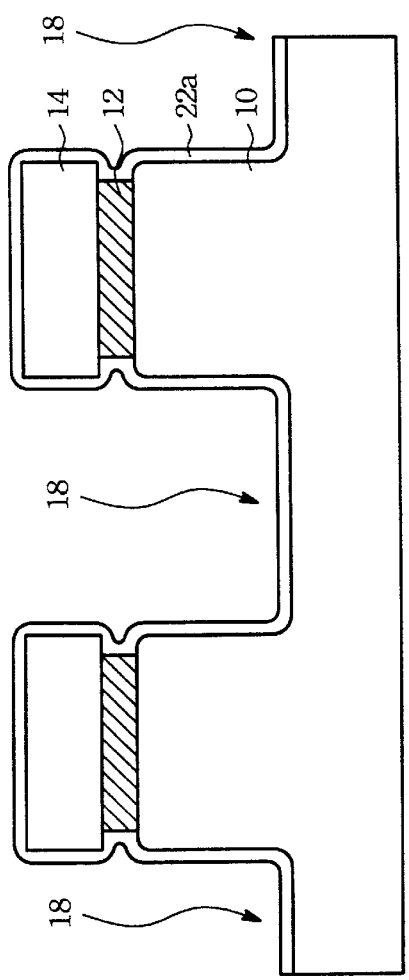
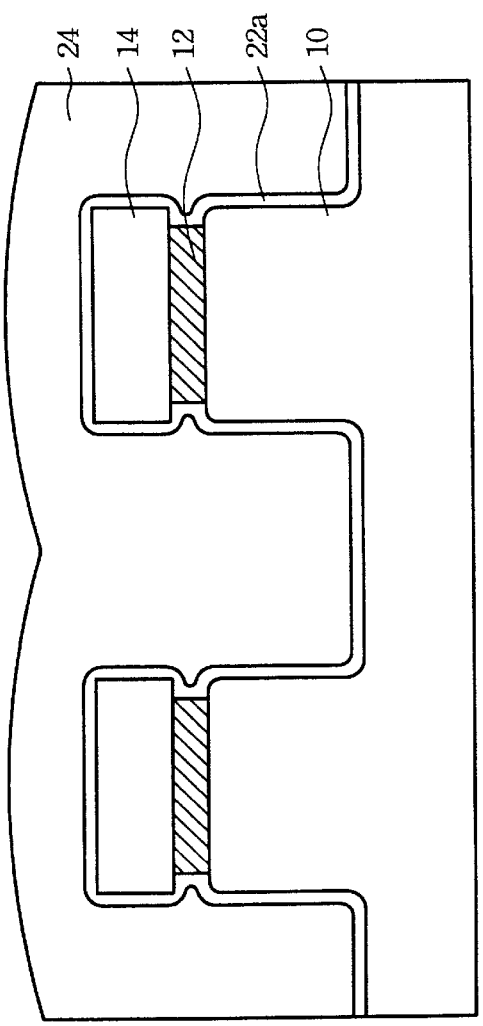

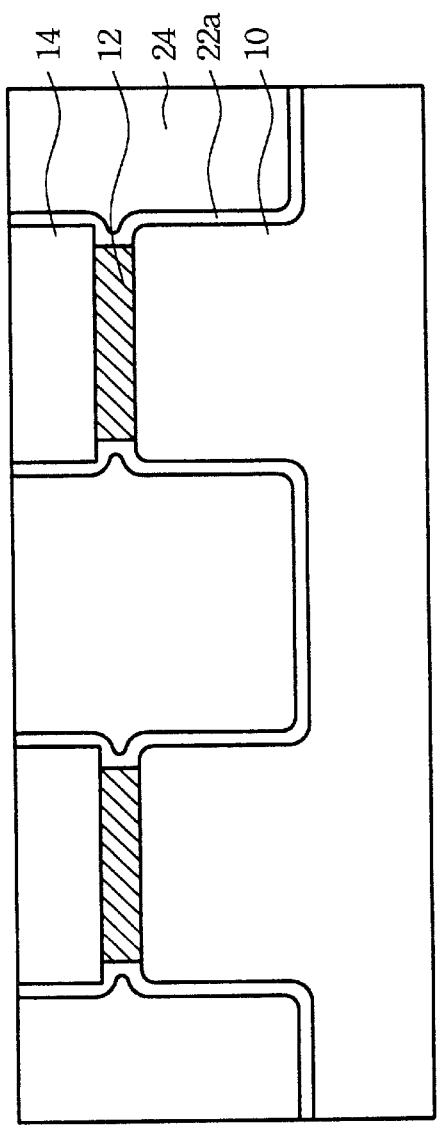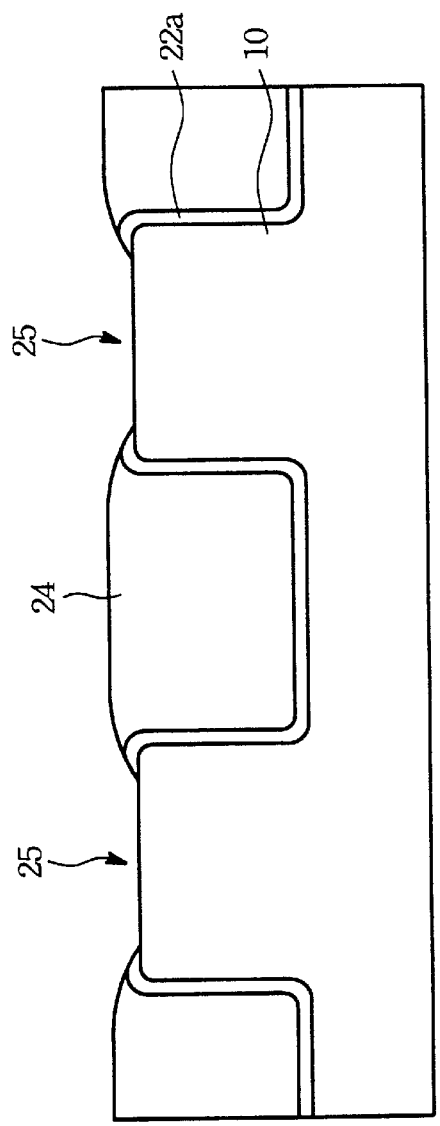

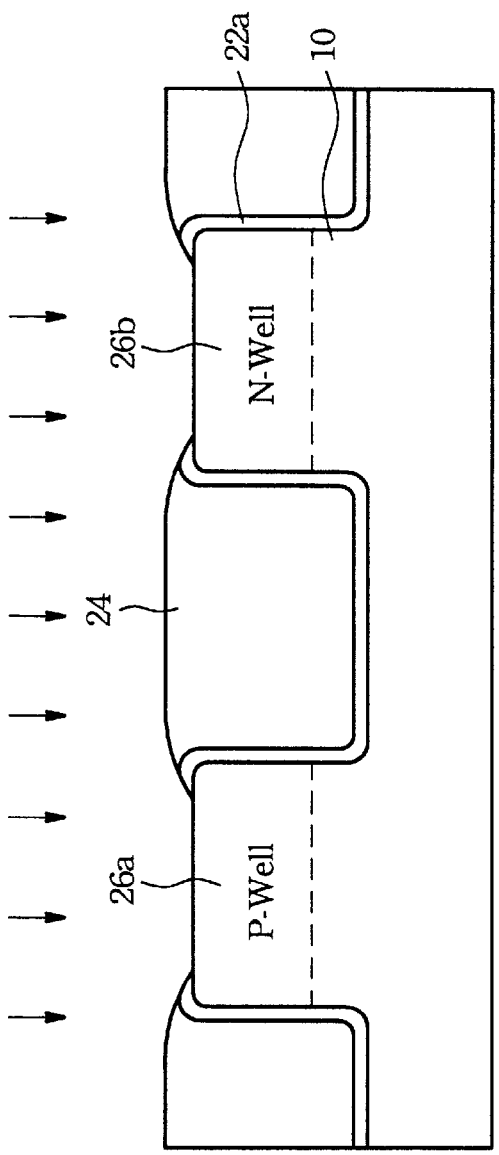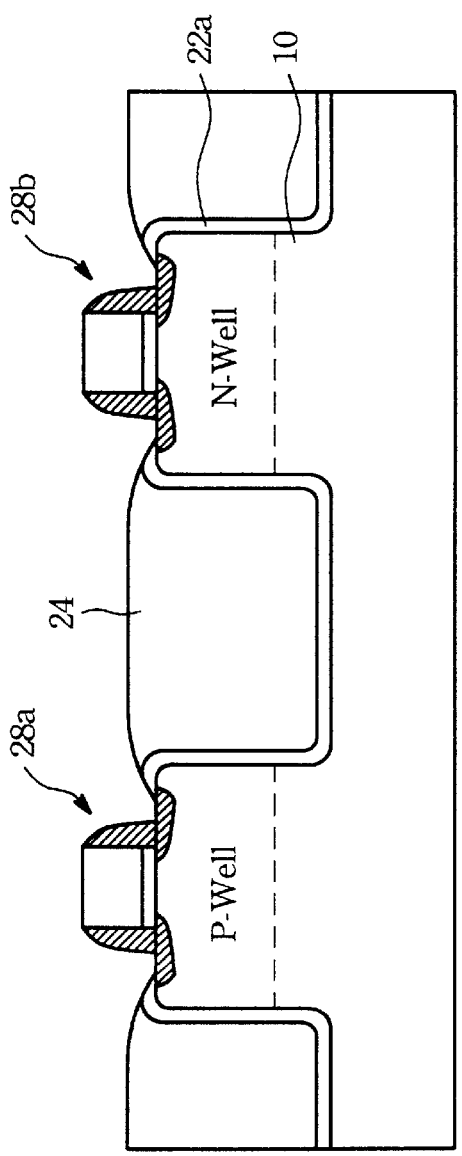

METHOD FOR FORMING TRENCH ISOLATION REGIONS

Cross Reference to Related Applications

This is a continuation-in-part of U.S. patent application Ser. No. 09/034,635, filed Mar. 4, 1998, now U.S. Pat. No. 5,985,737.

This invention is a continuation-in-part application of an application filed under the title of "METHOD FOR FORMING AN ISOLATION REGION IN AN INTEGRATED CIRCUIT" with the Ser. No. of 09/034,635, which is assigned to the same assignee and has the same inventor as the present application.

BACKGROUND OF THE INVENTION

1. Field of the Invention

The present invention relates to a semiconductor process of integrated circuit devices. More particularly, the present invention relates to a method for forming trench isolation regions on a semiconductor substrate.

2. Description of the Prior Art

The art of isolating semiconductor devices becomes one important aspect of modern metal-oxide-semiconductor (MOS) and bipolar integrated circuit technology. With increasing densities of up to hundreds of thousands of devices on a single chip, improper isolation among devices will cause current leakage. These current leakages can consume significant amounts of power. In addition, improper isolation between devices can exacerbate latchup, which can damage the circuit temporarily or permanently. Still further, improper isolation can result in noise margin degradation, voltage shift or crosstalk.

In MOS technology, isolation is usually practiced by forming isolation regions between neighboring active regions. Typically, an isolation region is formed by ion-implanting a channel stop layer of polarity opposite to the source electrode and the drain electrode of the integrated circuit device, and growing a thick oxide, often referred to as field oxide (FOX). The channel stop and the FOX cause the threshold voltage in the isolation region to be much higher than those of the neighboring active devices, making surface inversion not likely to occur under the field oxide region.

The local oxidation of silicon (LOCOS) method is widely used to isolate active regions in silicon. In LOCOS technology, a silicon nitride layer is used as an efficient oxidation mask which prevents the oxidants from reaching the silicon surface covered by silicon nitride. In addition, the silicon nitride layer oxidizes very slowly compared to silicon. However, direct deposition of silicon nitride on silicon can cause stress induced defects when the structure is subjected to oxidation at elevated temperature. These defects can be considerably reduced by forming a thin (100–500 angstroms) pad oxide layer between the silicon and the silicon nitride. The pad oxide reduces the force transmitted to the silicon by relieving the stress. This arrangement thus acts as a buffer which cushions the transmission of stress between the silicon and the silicon nitride.

Unfortunately, the pad oxide layer provides a lateral path for oxidation of silicon. This lateral extension of oxidation through pad oxide is frequently referred to as a "bird's beak" because of its form. The extent of the bird's beak can be reduced by decreasing the thickness of the pad oxide, which, however will cause more stress induced defects from the above silicon nitride layer. Therefore, the thickness of the pad oxide and the silicon nitride layer must be optimized to minimize the extent of the bird's beak without generating defects.

Beside bird's beak effect, another important limitation is the sharp decrease in the field oxide thickness as the isolation spacing is reduced below 1 micrometer. The narrower the opening is, the thinner the field oxide will be. This effect is frequently called field oxide thinning effect, and is more serious for deem sub-micron semiconductor devices. The aforementioned bird's beak effect, the local field oxide thinning effect, and the stress-induced silicon defect are discussed in some references, such as that by Andres Bryant et al., "Characteristics of CMOS Device Isolation for the ULSI Age," IEDN Tech. Dig., 1994, pages 671–674 which is hereby incorporated by reference.

Several methods in the prior art have been designed for improving the LOCOS isolation process to minimize the bird's beak. For example, a nitride-clad LOCOS (NCL) isolation is disclosed, for example, by J. R. Pfiester et al., "Nitride-Clad LOCOS Isolation for 0.25 $\mu$m CMOS," VLSI Tech. Symp. Dig., 1993, pages 139–140 which is hereby incorporated by reference. Unfortunately, the NCL process usually causes some defects at the edge of the isolation region.

Another isolation method, called polysilicon buffer LOCOS (PBL) isolation, is also used to overcome the disadvantages of the conventional LOCOS method. See the reference by J. Nagel et al., "Stress-induced Void Formation in Interlevel Polysilicon Films during Polybuffered Local Oxidation of Silicon," J. Electrochem. Soc., vol. 140, 1993, pages 2356–2359 which is hereby incorporated by reference. One of the disadvantages induced from the PBL method is the formation of voids or pits.

Other isolation methods are also available. For example, the sealedinterface local oxidation (SILO) process uses an additional thin silicon nitride over the silicon substrate followed by forming a pad oxide layer and then a thick silicon nitride layer. The SILO process can reduce the bird's beak, but at the expense of generating more stress, more crystal defects, and higher leakage currents.

Another improved LOCOS method, called buried oxide (BOX) process, has been devised which uses an aluminum mask to etch a silicon groove and then subsequently remove a plasma deposited silicon dioxide layer. The BOX process can effectively reduce the bird's beak, but at the expense of manufacture complexity.

The trench isolation process, or the shallow trench isolation (STI) process, is another isolation process proposed especially for semiconductor chips with high integration. A trench region is formed in the semiconductor with a depth deep enough for isolating the devices or different wells. In general, a trench is etched and refilled with insulating materials in the trench isolation process. The refilled trench regions are developed for the application in the very large scale integration (VLSI) and ultra large scale integration (ULSI) level. In addition, capacitors can also be formed within the trench by filling both insulating and conductive materials sequentially for the application of forming memory cells.

The conventional LOCOS isolation process suffers the problems like large bird's beak, local field oxide thinning effect, and stress-induced silicon defects. In the aforementioned article titled "Characteristics of CMOS Device Isolation for the ULSI Age" by A. Bryant et al. (in IEDM Tech. Dig., p. 671, 1994), different isolation processes are investigated. They reviewed how LOCOS and STI isolation are being improved to meet the scaling requirements. The scalability of LOCOS for sub-half-micrometer CMOS technologies is a widely identified question. The issues like lateral extent of the LOCOS bird's beak, non-planarity, thinning, and stress-induced silicon defects are addressed in their work. It is concluded that future CMOS technology will require an effective device isolation method that provides abrupt transitions to active device regions with a minimum impact on device characteristics or topography.

At 1996, S. E. Kim et al. disclosed a LOCOS technology in the work "Nitride Cladded Ploy-Si Spacer LOCOS (NCPSL) Isolation Technology for the 1 Giga Bit DRAM" (in IEDM Tech. Dig., p. 825, 1996). The limitation of the conventional LOCOS technology with the scaling down of the devices is illustrated. Fully recessed LOCOS is one solution to the problem. However, simply recessing the field regions before field oxidation brings about excessive bird's beak penetration. They merged the concept of RPSL (Recessed Poly-Si Spacer LOCOS) and RNSL (Recessed Nitride Spacer LOCOS) to reduce the bird's beak length while maintaining the smooth edge profile by employing selective SiN deposition on poly-Si spacer.

Although with better isolating characteristics than the LOCOS process, the trench isolation process is suffered from a large defects induced by dry etching and sharp trench corner effects. In the work of P. C. Fazan and V. K. Mathews ("A Highly Manufacturable Trench Isolation Process for Deep Submicron DRAMs", in IEDM Tech. Dig., p. 57, 1993), the replacement of the LOCOS-based isolation schemes with the STI process is disclosed. STI provides a planar surface and a fully recessed field oxide, does not suffer from field oxide thinning, and can easily be scaled down for 1 to 4 Gb DRAM applications. However, STI also requires a much more complicated planarization procedure and carries the devices reverse narrow width effects. A trench isolation process combining tapered trench sidewalls, a trench reoxidation, a vertical B field implant, a CMP-only planarization, and disposable spacers to smooth the trench comers, is proposed in the work.

For solving the trench comer effects, many methods and structures have been developed. U.S. Pat. No. 5,521,422 to J. A. Mandelman is an example. In the work "Corner Protected Shallow Trench Isolation Device", a semiconductor structure to prevent gate wrap-around and corner parasitic leakage is proposed. A sidewall structure around the trench region is formed to solve the problems induced in the planarization process. The problems of the corner leakage and the recessed isolation insulator adjacent the corner is solved by the structure in their work with the additional sidewall structure.

SUMMARY OF THE INVENTION

In accordance with the present invention, a method is provided for forming trench isolation regions for integrated circuits. The trench isolations provides improved comer rounding and reduced undesired stress effects.

The method for forming an isolation region in the present invention mainly includes the following steps. At first, a pad layer is formed on a semiconductor substrate and an oxidation masking layer is formed on the pad layer. The pad layer is provided to relieve the stress from the oxidation masking layer. The oxidation masking layer, the pad layer, and the substrate are then patterned to form trenches in the substrate. The pad layer is removed laterally to form undercut structures under the oxidation masking layer. A doped layer is conformably formed on the oxidation masking layer, the undercut structures of the pad layer, and the substrate in the trenches.

Next, a thermally oxidizing step is carried out to oxidize the doped layer to form an oxidized layer conformably on the oxidation masking layer, the undercut structures of the pad layer, and the substrate in the trenches. A dielectric layer is formed over the substrate to fill up the trenches and cover over the pad layer and the oxidation masking layer. The dielectric layer is planarized downward to portions of the oxidation masking layer. Finally, the oxidation masking layer and the pad layer are removed.

In the preferred embodiments, the doped layer is selected to have a greater oxidation resistance than the pad layer. In addition, the doped layer is preferably a material which generates less stress than the oxidation masking layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 5 illustrates a cross-sectional view of thermally oxidizing the doped layer to form an oxidized layer conformably on the oxidation masking layer, the undercut structures of the pad layer, and the substrate in the trenches, in accordance with the present invention;

FIG. 6 illustrates a cross-sectional view of forming a dielectric layer over the substrate to fill up the trenches and cover over the pad layer and the oxidation masking layer in accordance with the present invention;

FIG. 7 illustrates a cross-sectional view of planarizing the dielectric layer downward to portions of the oxidation masking layer in accordance with the present invention;

FIG. 8 illustrates a cross-sectional view of removing the oxidation masking layer and the pad layer in accordance with the present invention;

FIG. 9 illustrates a cross-sectional view of forming wells on active area in accordance with the present invention; and FIG. 10 illustrates a cross-sectional view of forming devices in the regions between trench isolations in accordance with the present invention.

DESCRIPTION OF THE PREFERRED EMBODIMENT

Figure 1:
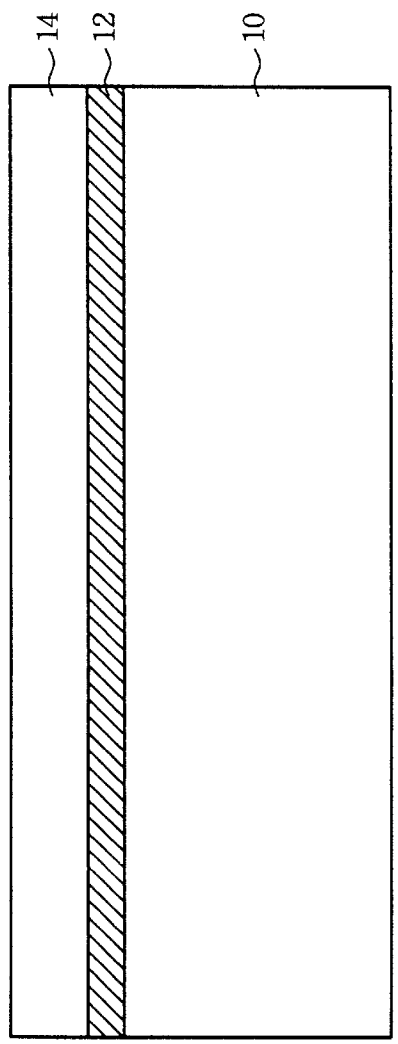
FIG. 1 shows a cross-section view of a semiconductor substrate, whereon a pad oxide layer and a silicon nitride layer are formed according to one embodiment of the present invention.

FIG. 1 shows a schematic cross-section of a semiconductor substrate 10. A pad layer of silicon oxide layer 12 is grown, for example, in a thermal furnace with an oxygen-containing ambient. In this embodiment, the thickness of the silicon oxide layer 12 is preferably in the range of about 50 to 350 angstroms. Then, an oxidation masking layer of silicon nitride layer 14 is deposited, for example, using a low pressure chemical vapor deposition (LPCVD) process. The silicon nitride layer 14 has a thickness of about 500 to 3000 angstroms.

The silicon oxide layer 12 is frequently referred as a pad oxide in isolation technology and is used to reduce the force transmitted from the silicon nitride layer 14 to the substrate 10. The silicon nitride layer 14 is, however, used as an oxidation mask which prevents the oxidants from reaching the substrate 10 under the silicon nitride layer 14 in a later oxidation step. The regions of forming trench isolations are opened in the photoresist layer 16.

Figure 2:
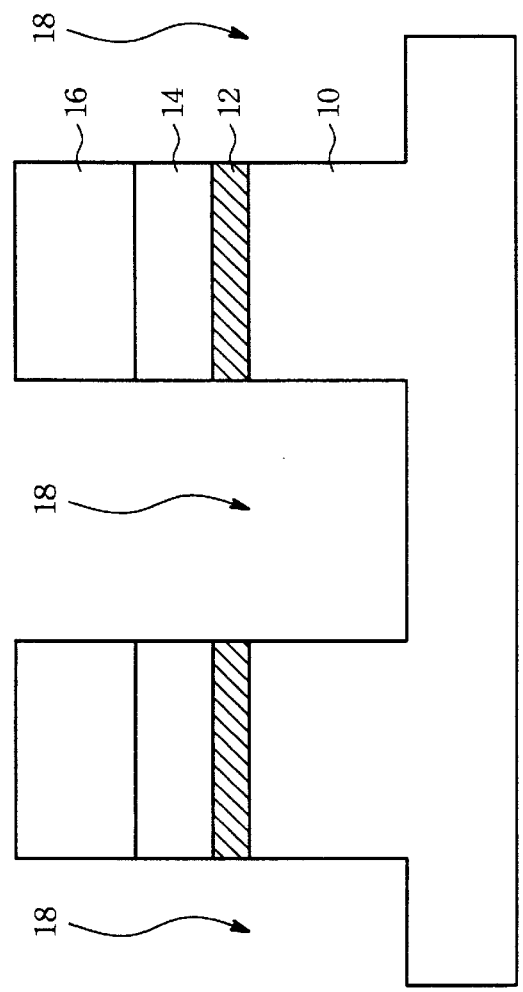
FIG. 2 illustrates a cross-sectional view of patterning the oxidation masking layer, the pad layer, and the substrate to form trenches in the substrate in accordance with the present invention.

Thereafter, as shown in FIG. 2, a photoresist masking layer 16 having an active region (or active area) pattern is formed over the silicon nitride layer 14. This pattern is defined using standard photoresist coating, exposure and development processes in the conventional lithography technology. The regions of forming trench isolations are opened in the photoresist layer 16.

Next, the silicon nitride layer 14, the pad oxide layer 12, and the substrate 10 are etched using the photoresist layer 16 as a mask, in order to form trenches 18 in the substrate 10. FIG. 2 shows the structure after anisotropically etching the silicon nitride layer 14, the pad oxide 12, and the substrate. In the preferred embodiments, the patterning step can be performed with reactive ion etch (RIE) processes.

Figure 3:
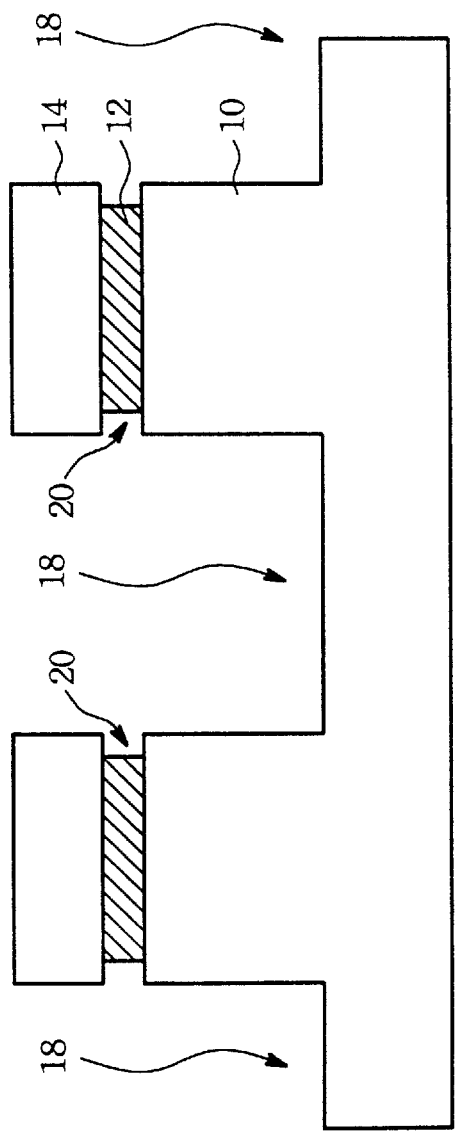
FIG. 3 illustrates a cross-sectional view of laterally removing the pad layer to form undercut structures under the oxidation masking layer in accordance with the present invention.

Referring to FIG. 3, a portion of the pad oxide layer 12 is isotropically etched to form lateral undercut structures 20 under the silicon nitride layer 14. The lateral width of the undercut is preferably between 100 to 500 angstroms. Typically, a wet etchant such as a diluted hydrofluoric (HF) solution is used because it has the advantage of dissolving silicon dioxide without attacking silicon and silicon nitride. Practically, the HF is mixed with ammonium fluoride ($NH_4F$), known as a buffered oxide etch (BOE), to slow down the etch rate into a more controllable process.

Figure 4:
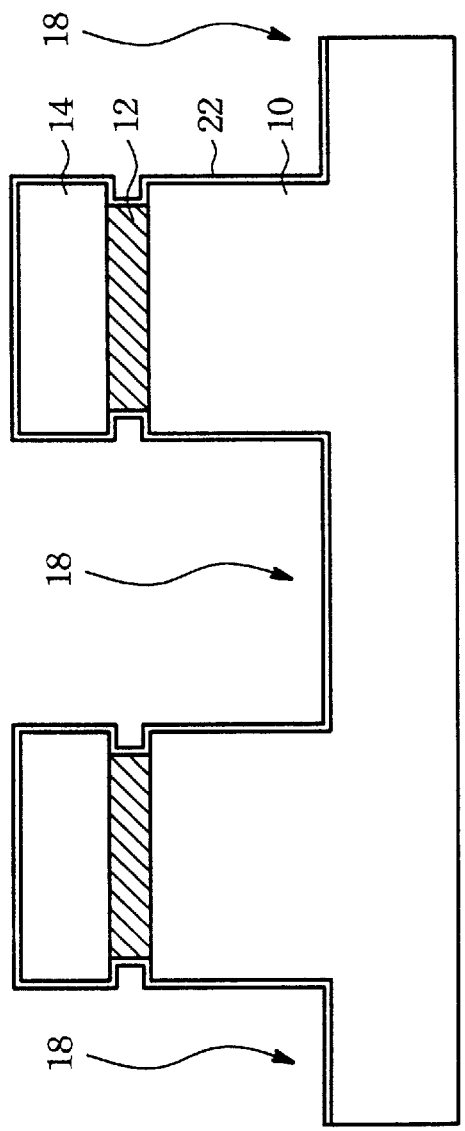
FIG. 4 illustrates a cross-sectional view of conformably forming a doped layer on the oxidation masking layer, the undercut structures of the pad layer, and the substrate in the trenches, in accordance with the present invention.

Next, a nitrogen-doped anti-oxidation layer 22, such as nitrogen-doped polysilicon or nitrogen-doped amorphous-silicon, is conformably deposited on the silicon nitride layer 14, the undercut structures 20 of the silicon oxide layer 12, and the trenches 18 in the substrate 10, as shown in FIG. 4. The nitrogen-doped amorphous-silicon layer 22 can prevent void or pit formation, and also can reduce leakage. As shown in FIG. 4, the undercut structures 20 adjacent to the remaining pad oxide layer 12 are also covered with a thin layer of the nitrogen-doped layer 22, so that the remaining pad oxide 12 is encapsulated by the nitrogen-doped layer 22.

In this embodiment, this nitrogen-doped layer 22 is preferably deposited using a conventional low pressure chemical vapor deposition (LPCVD) process to a thickness between about 50 to 500 angstroms. It is noted that the nitrogen-doped layer 22 has greater oxidation hardness (or resistance) than the pure oxide of the pad oxide layer 12. The control of the oxidation resistance in the nitrogen-doped layer 22 is preferably achieved by adjusting the dosage of nitrogen atoms in the nitrogen-doped layer 22. Furthermore, the mechanical stress from the nitrogen-doped layer 22 to the substrate is less than that of silicon nitride in the conventional nitride-clad LOCOS method.

It is appreciated that the doping material other than the nitrogen in the antioxidation layer 22 can also be used without departing from the scope of the claimed invention, provided that the resultant doped anti-oxidation has greater oxidation hardness than the pure oxide, or/and has mechanical stress less than that of silicon nitride. In the preferred embodiments, the dose of nitrogen atoms in the doped silicon layer is about 1E18 to 5E21 atoms/$cm^2$.

The doped layer 22 of FIG. 4 is then subjected to thermal oxidation or steam oxidation to thermally grow an oxidized layer 22a conformably on the oxidation masking layer 14, the undercut structures 20 of the pad layer 12, and the substrate 10 in the trenches 18, as illustrated in FIG. 5. Since the doped layer 22 is a nitrogen-doped silicon layer in the preferred embodiments, the oxidized layer 22a can either be a silicon oxide layer or a silicon oxynitride layer. Portions of silicon in the substrate 10 closing to the trench corner and surface are also oxidized in the preferred embodiments. The etching damage on the surface silicon during the patterning process of forming trenches 18 are recovered with the thermal oxidation process and the edge region near the trench corner on the substrate is rounded with the consumption of substrate silicon material.

Furthermore, during the oxidation stage, the nitrogen atoms in the antioxidation layer 22 will diffuse into the substrate 10 near the trenches 18, improving the bird's beak effect under oxidation and the oxidation-induced stress. In the preferred embodiments, the dose of nitrogen in the doped layer 22 is about 1E18 to 5E21 atoms/$cm^2$ for providing the aforementioned stress prevention effect.

Turning to FIG. 6, a dielectric layer 24 is then formed over the substrate 10 to fill up the trenches 18, and also to cover over the pad layer 12 and the oxidation masking layer 14. In the case, the dielectric layer 24 is a silicon oxide layer. The thick silicon oxide layer is preferably formed with a deposition process such as a chemical vapor deposition (CVD) or a plasma-enhanced chemical vapor deposition (PECVD). In the typical silicon oxide deposition process, a major reaction gas such as tetra-ethylortho-silicate (TEOS) is used. After the TEOS-silicon oxide deposition, a thermal anneal process is performed to density the deposited silicon oxide and improve the characteristics of the silicon oxide as an insulation material.

Referring to FIG. 7, the dielectric layer 24 is then planarized downward from the top surface until portions of the oxidation masking layer 14 is contacted or removed. In the preferred embodiments, a chemical-mechanical polish is carried out in the planarization step to remove the surface dielectric layer 24.

Turning to FIG. 8, the oxidation masking layer 14 of silicon nitride and the pad layer 12 of silicon oxide are removed. In the preferred embodiments, the two layers are removed with two wet etch steps. The oxidation masking layer 14 of silicon nitride is removed with a hot phosphoric solution, and the pad layer 12 of silicon oxide is removed with diluted hydrofluoric (HF) solution, or the aforementioned buffered oxide etchant (BOE), to slow down the etch rate into a more controllable process.

During the etching of the pad layer 12 of silicon oxide, the diluted hydrofluoric (HF) solution or the buffered oxide etchant (BOE) also removes portions of the dielectric layer 24 and the oxidized layer 22a. In the preferred embodiments, the remaining portion of the dielectric layer 24 and the oxidized layer 22a are left with a higher level than the substrate surface. In the illustrated case, the remaining portion of the dielectric layer 24 and the oxidized layer 22a cover the edge region of the active area for forming devices.

Afterwards, a series processes of high energy (about 1–3 MeV, and $10^{12}$–$10^{14}$ ions/$cm^2$) implantations respectively with accompany masking patterns for different well regions are performed to form retrograde twin wells 26a and 26b, respectively with p-type and n-type dopants, as shown in FIG. 9. Finally, semiconductor devices, such as metal-oxide-semiconductor field effect transistors (MOSFETs) 28*a* and 28*b*, are fabricated with typical transistor fabrication process, resulting in the structure of FIG. 10.

As is understood by a person skilled in the art, the foregoing descriptions of the preferred embodiment of the present invention are illustrations of the present invention rather than limitations thereon. They are intended to cover various modifications and similar arrangements included within the spirit and scope of the appended claims. The scope of the claims should be accorded to the broadest interpretation so as to encompass all such modifications and similar structures. While the preferred embodiments of the invention have been illustrated and described, it will be appreciated that various changes can be made therein without departing from the spirit and scope of the invention.

What is claimed is:

1. A method for forming an isolation region, said method comprising:

forming a pad layer on a semiconductor substrate;

forming an oxidation masking layer on said pad layer, said pad layer relieving stress from said oxidation masking layer;

patterning said oxidation masking layer, said pad layer, and said substrate to form trenches in said substrate;

laterally removing said pad layer to form undercut structures under said oxidation masking layer;

conformably forming a doped layer on said oxidation masking layer, said undercut structures of said pad layer, and said substrate in said trenches;

thermally oxidizing said doped layer to form an oxidized layer conformably on said oxidation masking layer, said undercut structures of said pad layer, and said substrate in said trenches;

forming a dielectric layer over said substrate to fill up said trenches and cover over said pad layer and said oxidation masking layer;

planarizing said dielectric layer downward to portions of said oxidation masking layer; and removing said oxidation masking layer and said pad layer.

2. The method according to claim 1, wherein said doped layer has a greater oxidation resistance than said pad layer.

3. The method according to claim 1, wherein said doped layer generates less stress than said oxidation masking layer.

4. The method according to claim 1, wherein said pad layer comprises silicon oxide.

5. The method according to claim 1, wherein said oxidation masking layer comprises silicon nitride.

6. The method according to claim 1, wherein said doped layer comprises nitrogen-doped polysilicon.

7. The method according to claim 1, wherein said doped layer comprises nitrogen-doped amorphous-silicon.

8. The method according to claim 1, wherein said oxidized layer is a silicon oxide layer or a silicon oxynitride layer.

9. The method according to claim 1, wherein said planarizing step is performed by a chemical-mechanical polishing.

10. A method for forming an isolation region, said method comprising:

forming a pad layer on a semiconductor substrate;

forming an oxidation masking layer on said pad layer, said pad layer relieving stress from said oxidation masking layer;

patterning said oxidation masking layer, said pad layer, and said substrate to form trenches in said substrate;

laterally removing said pad layer to form undercut structures under said oxidation masking layer;

conformably forming a doped layer on said oxidation masking layer, said undercut structures of said pad layer, and said substrate in said trenches, said doped layer comprising a nitrogen-doped silicon layer;

thermally oxidizing said doped layer to form an oxidized layer conformably on said oxidation masking layer, said undercut structures of said pad layer, and said substrate in said trenches;

forming a dielectric layer over said substrate to fill up said trenches and cover over said pad layer and said oxidation masking layer;

planarizing said dielectric layer downward to portions of said oxidation masking layer; and removing said oxidation masking layer and said pad layer.

11. The method according to claim 10, wherein said doped layer has a greater oxidation resistance than said pad layer.

12. The method according to claim 10, wherein said doped layer generates less stress than said oxidation masking layer.

13. The method according to claim 10, wherein said pad layer comprises silicon oxide.

14. The method according to claim 10, wherein said oxidation masking layer comprises silicon nitride.

15. The method according to claim 10, wherein said oxidized layer is a silicon oxide layer or a silicon oxynitride layer.

16. The method according to claim 10, wherein said planarizing step is performed by a chemical-mechanical polishing.

17. The method according to claim 1, wherein the dosage in said doped layer is about 1E18 to 5E21 atoms/$cm^2$.

18. The method according to claim 10, wherein the dosage of nitrogen in said doped layer is about 1E18 to 5E21 atoms/$cm_2$.

* * * * *